(12) United States Patent
Kanata et al.

(10) Patent No.: US 7,629,672 B2
(45) Date of Patent: Dec. 8, 2009

(54) SEMICONDUCTOR DEVICES AND MANUFACTURING METHOD THEREOF

(75) Inventors: Tetsuya Kanata, Toyota (JP); Shinichi Umekawa, Himeji (JP); Koji Terada, Himeji (JP); Yasushi Takahashi, Kanazawa (JP)

(73) Assignees: Toyota Jidosha Kabushiki Kaisha, Toyota-shi, Aichi-ken (JP); Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 11/607,064

(22) Filed: Dec. 1, 2006

(65) Prior Publication Data

US 2007/0126086 A1 Jun. 7, 2007

(30) Foreign Application Priority Data

Dec. 6, 2005 (JP) ............................. 2005-352521

(51) Int. Cl.
 *H01L 21/00* (2006.01)
 *H01L 21/84* (2006.01)
(52) U.S. Cl. .................. 257/637; 257/626; 257/627; 257/638; 257/E21.219; 257/E21.26; 438/127; 438/149; 438/692; 438/693
(58) Field of Classification Search ................ 257/626, 257/627, 637, 638; 438/127, 149
 See application file for complete search history.

(56) References Cited

U.S. PATENT DOCUMENTS 5,962,581 A 10/1999 Hayase et al.
6,693,046 B2 * 2/2004 Takigawa et al. ............ 438/761
6,890,605 B2 5/2005 Nishikawa et al.
7,291,970 B2 11/2007 Kuwabara
2002/0036289 A1 * 3/2002 Tamura et al. ................ 257/64
2005/0057151 A1 3/2005 Kuwabara
2006/0166411 A1 * 7/2006 Morisue et al. ............. 438/149

FOREIGN PATENT DOCUMENTS

| CN | 1406107 A | 3/2003 |
|---|---|---|
| CN | 1467818 A | 1/2004 |
| CN | 1479358 A | 3/2004 |
| JP | 07-153921 | 6/1995 |
| JP | 2001064416 | 3/2001 |
| JP | 2003115485 | 4/2003 |
| JP | 2004127933 | 4/2004 |
| JP | 2004295149 | 10/2004 |

OTHER PUBLICATIONS

Chinese Office Action dated Apr. 4, 2008.
Journal of Guangzhou University (Natural Science Edition), vol. 1. No. 6, p. 12-13, Nov. 2002.
Chinese Office Action dated Apr. 4, 2008.

* cited by examiner

*Primary Examiner*—Dao H Nguyen
(74) *Attorney, Agent, or Firm*—Finnegan, Henderson, Farabow, Garrett & Dunner, LLP

(57) ABSTRACT

A semiconductor device is provided with a semiconductor substrate having circuit elements formed therein, and an insulating protective film formed on the semiconductor substrate. Hydroxyl groups (OH) are attached to a surface of the protective film. As a result, the contact angle between surface of the protective film and a water droplet is less than or equal to 40 degrees.

4 Claims, 4 Drawing Sheets

SEMICONDUCTOR DEVICES AND MANUFACTURING METHOD THEREOF

CROSS REFERENCE TO RELATED APPLICATION

This application claims priority to Japanese Patent Application No. 2005-352521 filed on Dec. 6, 2005, the contents of which are hereby incorporated by reference into the present application.

BACKGROUND OF THE INVENTION

1. Field of the Invention

The present invention relates to a semiconductor device comprising a semiconductor substrate having circuit elements formed therein and a protective film formed on the semiconductor substrate. The present invention also relates to a manufacturing method of this type of semiconductor device.

2. Description of the Related Art

A semiconductor device generally comprises a semiconductor substrate having circuit elements that are formed within the semiconductor substrate. Generally, a protective film is formed on the semiconductor substrate in order to insulate and/or protect the circuit elements from the external environment. Typically, imide resin such as polyimide is used to form an organic protective film. On the other hand, silicon oxide, silicon nitride, silicon oxynitride, phosphorus glass, and the like are used to form an inorganic protective film. The material to form the protective film varies depending on usage of the semiconductor device.

It is known that electrical charges accumulate on the surface of and/or within the protective film during a manufacturing process, a packaging process, a shipping process and/or a using process of the semiconductor device. This phenomenon is due to a number of causes. For example, contact with cutting water during dicing process causes electrical charges to accumulate on the surface of and/or within the protective film. An exposure to dry air during a solder reflow process causes electrical charges to accumulate on the surface of and/or within the protective film. Further, friction with paper during the shipping process causes electrical charges to accumulate on the surface of and/or within the protective film. The above-mentioned reasons cause negative charges to accumulate on the surface of and/or within the protective film. When negative charges accumulate on the surface of and/or within the protective film, positive charges that are attracted by the negative charges accumulate in the surface portion of the semiconductor substrate. This phenomenon disrupts the balance of electrical charges within the semiconductor substrate, thereby creating problems such as lowering the breakdown voltage of the circuit elements formed within the semiconductor substrate.

Japanese Laid-Open Patent Publication No. 1995-153921 discloses a technique for forming a conductive layer within the protective film in order to discharge negative charges that accumulate within the protective film.

BRIEF SUMMARY OF THE INVENTION

Forming the conductive layer within the protective film as disclosed in Japanese Laid-Open Patent Publication No. 1995-153921 requires many manufacturing steps, which inevitably leads to a substantial increase in manufacturing cost.

The objective of the present invention is to teach a simpler and more convenient technique for reducing the amount of electrical charges that accumulates on the surface of and/or within the protective film.

According to one aspect of the present teachings, a technique is provided for decreasing the amount of electrical charges that accumulates on the surface of and/or within the protective film by means of processing the surface of the protective film. Processing the surface of the protective film can be implemented in a simpler and more convenient way compared to forming the conductive layer within the protective film. Therefore, the technique of the present invention can reduce the amount of electrical charges that accumulates on the surface of and/or within the protective film without substantially increasing manufacturing cost.

The present invention teaches two techniques of processing the surface of the protective film for reducing the amount of electrical charges that accumulates on the surface of and/or within the protective film. The techniques according to the present teachings commonly adopt a unique technical feature, namely, processing the surface of the protective layer.

According to one aspect of the present teachings, a semiconductor device comprises a semiconductor substrate having circuit elements formed within the semiconductor substrate, and a protective film formed on the semiconductor substrate. The semiconductor device of this teaching is characterized in that the surface of the protective film is processed so that a contact angle between the surface of the protective film and a water droplet is less than or equal to 40 degrees. Specifically, the surface of the protective film of the semiconductor device is processed so that the surface becomes hydrophilic.

Protective films used for this type of semiconductor devices are generally hydrophobic (or water-repellent). However, the surface of the protective film of the semiconductor device of the present teaching is processed to be hydrophilic, which notably differentiates the protective film of the semiconductor device of the present teaching from that of prior art.

The term 'circuit element' used herein refers to functional elements that configure or make up a circuit. Typically, circuit elements include switching elements, diode elements, resistor elements, etc.

The protective film need not be formed over the entire semiconductor substrate. The protective film may be formed on at least a portion of the semiconductor substrate. For example, in a case where wire-bonding is necessary for the circuit elements, the protective film may not be formed on the electrodes of those circuit elements.

By processing the surface of the protective film so that the surface becomes hydrophilic, a condition can be attained where a high density of water molecules collect at the surface of the protective film. The water molecules that collect at the surface of the protective film bond with the electrical charges that accumulate on the surface of the protective film, thereby ionizing the water molecules. In this way, the electrical charges that accumulate on the surface of and/or within the protective film are discharged to the outside as ionized water molecules. As a result of processing the surface of the protective film so that the surface becomes hydrophilic, the amount of electrical charges that accumulates at the surface of and/or within the protective film is reduced.

According to one aspect of the present teachings, it is preferable that hydroxyl groups are attached on the surface of the protective film. By attaching hydroxyl groups on the surface of the protective film, properties of the surface of the protective film can be altered so that the surface becomes hydrophilic.

A semiconductor device according to another aspect of the present teachings, is characterized in that the surface of the protective film is processed so that the surface of the protective film becomes a coarse surface.

By processing the surface of the protective film so that the surface becomes coarse, the area on the surface of the protective film that scrapes against paper or other objects during the shipping process of the semiconductor device can be reduced, which in turn reduces the amount of electrical charges that accumulates at the surface of and/or within the protective film. At the same time, by processing the surface of the protective film so that the surface becomes coarse, the area on the surface that contacts gas and liquid also increases. Therefore, in some cases, the area of the surface exposed to dry air increases (for example, during a solder reflow process), and consequently, the amount of electrical charges that accumulates on the surface of and/or within the protective film might also increase. However, the amount of decrease in the electrical charges (decrease that results from the decrease in the area on the surface of the protective film that scrapes against paper or other objects) is larger than the amount of increase in the electrical charges (increase that results from the increase in the area on the surface that contacts gas and liquid). Therefore, by processing the surface of the protective film so that the surface becomes the coarse surface, the overall amount of electrical charges that accumulate on the surface of and/or within the protective film can be reduced. Processing the surface of the protective film so that the surface becomes the coarse surface has significantly positive effects.

According to one aspect of the present teachings, it is preferable that the average surface coarseness (Ra) of the protective film is greater than or equal to 8 nm and that the maximum surface coarseness (Rmax) thereof is greater than or equal to 35 nm.

If the average surface coarseness (Ra) of the protective film is greater than or equal to 8 nm and the maximum surface coarseness (Rmax) thereof is greater than or equal to 35 nm, the area on the surface of the protective film that scrapes against paper or other objects during the shipping process of the semiconductor device can be significantly reduced, which in turn reduces the amount of electrical charges that accumulates at the surface of and/or within the protective film.

If the surface of the protective film is both hydrophilic and coarse, the amount of electrical charges that accumulates at the surface of and/or within the protective film is significantly reduced. The reason is that, by processing the surface of the protective film so that the surface is hydrophilic and coarse, the probability increases that the water molecules that accumulate on the surface of the protective film will bond with the electrical charges that accumulate at the surface and/or within the protective film. Specifically, bonding is promoted between the water molecules and the electrical charges. As a result, the electrical charges that accumulate on the surface of and/or within the protective film are discharged to the outside as ionized water molecules, and therefore, the amount of electrical charges that accumulates at the surface of and/or within the protective film is significantly reduced.

According to one aspect of the present teachings, a novel method for manufacturing a semiconductor device can be provided. A method for manufacturing the semiconductor device comprises a step of forming the protective film on the semiconductor substrate having circuit elements formed therein, and a step of hydrophilizing the surface of the protective film.

The step of hydrophilizing the surface of the protective film can be implemented by performing an alcohol process on the surface of the protective film. By performing the alcohol process on the surface of the protective film, hydroxyl groups can be attached on the surface of the protective film. Alternatively, the hydrophilizing can be implemented by performing a silicon oxide powder process on the surface of the protective film. By coating the surface of the protective film with silicon oxide powder, hydroxyl groups can be attached on the surface of the protective film.

Another method of manufacturing a semiconductor device according to one aspect of the present teachings, comprises a step of forming the protective film on the semiconductor substrate having circuit elements and a step of coarsening the surface of the protective film.

The step of coarsening the surface of the protective film can be implemented by performing a sputtering process using inert gas on the surface of the protective film. By sputtering the surface of the protective film with inert gas, the surface of the protective film can be physically damaged. As a result, the surface of the protective film can be made coarse.

The aforementioned steps of hydrophilizing and coarsening the surface of the protective film can be implemented with a single process. In this case, a method of manufacturing the semiconductor device comprises a step of forming the protective film on the semiconductor substrate having circuit elements, and a step of plasma processing the surface of the protective film with $O_2$ plasma. By plasma processing the surface of the protective film with $O_2$ plasma, the surface of the protective film is ashed, and hydroxyl groups are attached on the surface of the protective film. As a result, the surface of the protective film becomes both hydrophilic and coarse.

It is preferable that the protective film contains polyimide, silicon oxide, or silicon nitride.

The above-mentioned materials are commonly used to form the protective film. The present invention is well-suited for treating these materials.

According to one aspect of the present teachings, the amount of electrical charges that accumulates on the surface of and/or within the protective film can be reduced by processing the surface of the protective film so that the surface becomes hydrophilic. According to one aspect of the present teachings, the amount of electrical charges that accumulates on the surface of and/or within the protective film can be reduced by processing the surface of the protective film so that the surface becomes coarse. The steps for processing the surface of the protective film do not lead to a significant increase in manufacturing cost. By using the simple and convenient method, the present invention can reduce the amount of electrical charges that accumulates on the surface of and/or within the protective film.

DETAILED DESCRIPTION OF THE INVENTION

Preferred features to practice the present invention are described below.

(First feature) An organic protective film contains imide resin material such as polyimide. Preferable methods for hydrophilizing a surface of the organic protective film include an alcohol process, silicon oxide powder process, and $O_2$ plasma process. Preferable methods for coarsening the surface of the organic protective film include an inert gas sputtering process and $O_2$ plasma process.

(Second feature) An inorganic protective film contains silicon oxide, silicon nitride, silicon oxynitride, phosphorus glass, etc. Preferable methods for hydrophilizing a surface of the inorganic protective film include an alcohol process, silicon oxide powder process, and $O_2$ plasma process. Preferable methods for coarsening the surface of the inorganic protective film include an inert gas sputtering process and $O_2$ plasma process.

(Third feature) Alcoholic materials to be used in the alcohol process are preferably IPA (isopropyl alcohol), ethanol, etc.

(Fourth feature) Inert gas to be used in the sputtering process is preferably argon gas (Ar), Flourine (F), etc.

First Representative Embodiment

Figure 1:
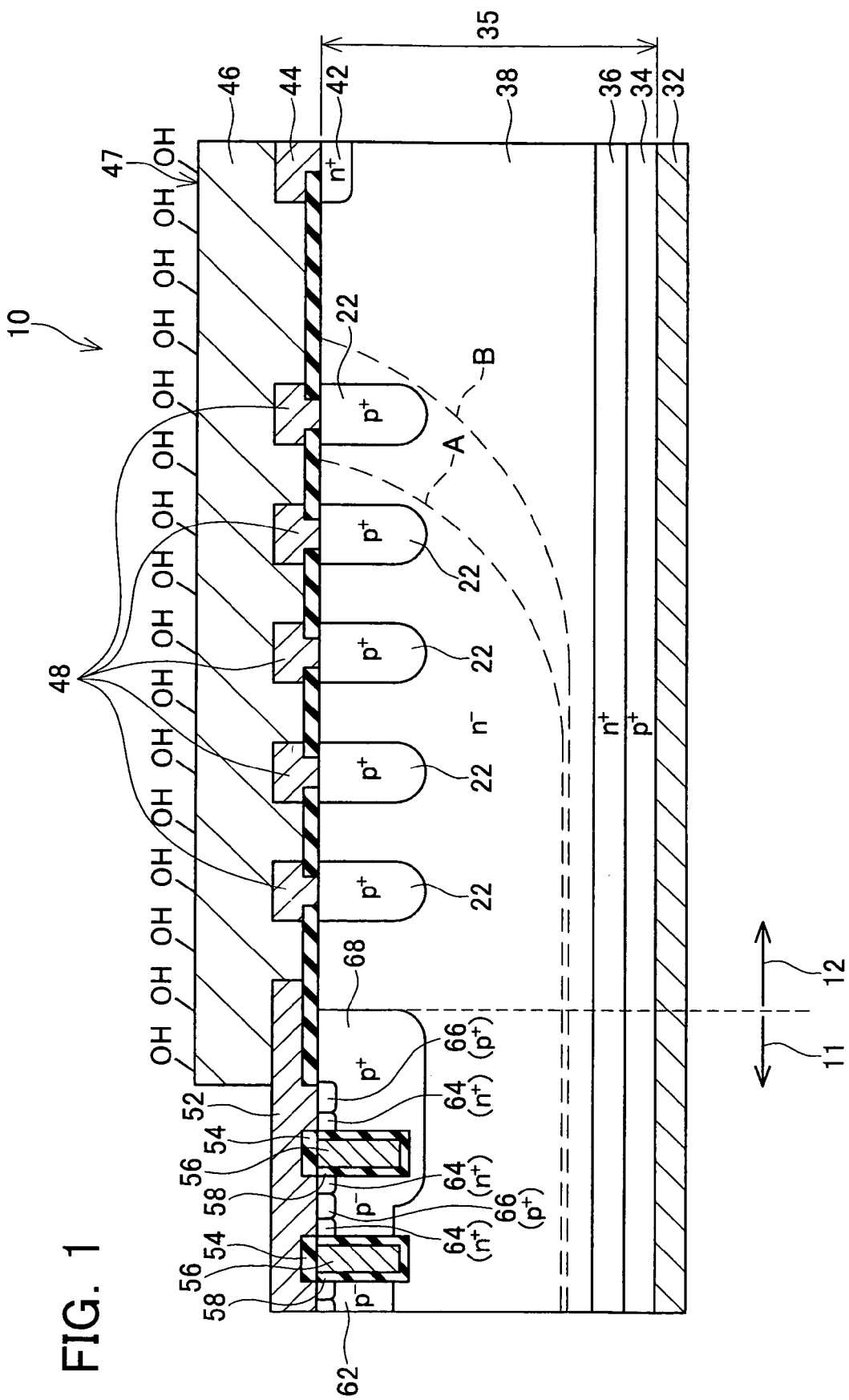
FIG. 1 is a simplified cross-sectional diagram showing a main portion of a semiconductor device according to a first embodiment.

FIG. 1 is a simplified cross-sectional diagram showing a main portion of semiconductor device 10. Semiconductor device 10 is provided with a vertical field IGBT (Insulated Gate Bipolar Transistor, which is an example of a circuit element). The vertical field IGBT is provided with a central region 11 and a surrounding region 12. A plurality of semiconductor switching structure is formed within the central region 11. A semiconductor structure for increasing the breakdown voltage of the semiconductor device 10 is formed within the surrounding zone 12. FIG. 1 shows a border portion between the central region 11 and the surrounding region 12. The central region 11 extends towards the left side of the figure.

Semiconductor device 10 is provided with semiconductor substrate 35 and protective film 46 formed on semiconductor substrate 35.

Semiconductor substrate 35 is provided with collector region 34, buffer region 36, and semiconductor active region 38. Collector region 34 contains a high density of p-type impurities (typically boron). Buffer region 36 contains a high density of n-type impurities (typically phosphorus). Semiconductor active region 38 contains a low density of n-type impurities. Collector electrode 32 is formed on a back surface of collector region 34.

Semiconductor active region 38 within surrounding region 12 is provided with a plurality of guard rings 22 and peripheral semiconductor region 42.

Guard rings 22 contain a high density of p-type impurities (typically boron). Guard rings 22 extend from a surface of semiconductor active region 38 to the depth thereof. Guard rings 22 are separated from each other by semiconductor active region 38. When viewed from a plane surface, guard rings 22 are formed to loop around the periphery of central region 11. Each guard rings 22 is electrically connected to each guard ring electrodes 48. Guard ring electrodes 48 are electrically isolated by protective film 46.

Peripheral semiconductor region 42 contains a high density of n-type impurities (typically boron). Peripheral semiconductor region 42 is electrically connected to peripheral contact electrode 44. Peripheral contact electrode 44 is fixed at the same electrical potential as collector electrode 32.

Semiconductor active region 38 of central region 11 is provided with body region 62, body contact regions 66, end body region 68, and emitter regions 64.

Body region 62 is formed on a surface of semiconductor active region 38 of central region 11, and contains p-type impurities (typically boron). Body contact regions 66 are formed within body region 64, and contain a high density of p-type impurities (typically boron). Body region 62 is electrically connected to emitter electrode 52 via body contact regions 66. End body region 68 is formed on an end portion of body region 62, and contains a high density of p-type impurities (typically boron). End body region 68 can be acknowledged as a portion of body region 62. End body region 68 covers gate electrode 56 and gate insulating film 58 near the boundary between central region 11 and surrounding region 12. End body region 68 weakens the electric field that tends to concentrate at gate electrode 56 and gate insulating film 58 near the boundary.

Emitter regions 64 are formed within body region 62, and are separated from semiconductor active region 38 by body region 62. Emitter regions 64 contain a high density of n-type impurities (typically phosphorus). Emitter regions 64 are electrically connected to emitter electrode 52.

A plurality of gate electrodes 56, each of which is covered by gate insulating film 58, is formed on the surface of semiconductor active region 38 of central region 11. Gate electrodes 56 face body region 62, which separate emitter region 64 from semiconductor active region 38, via gate insulating films 58. Gate electrodes 56 and emitter electrode 52 are electrically isolated by insulating films 54.

At the surface of semiconductor substrate 35, protective film 46 is selectively formed at portions corresponding to surrounding region 12. Polyimide is used to form protective film 46. To be more exactly, the surface of semiconductor substrate 35 covered with insulating films 54 and protective film 46 is selectively formed on insulating films 54. Protective film 46 may directly contact semiconductor substrate 35. The thickness of protective film 46 is adjusted to be approximately 2-20 μm. Protective film 46 is not formed at portions corresponding to central region 11. The region where protective film 46 is not formed is utilized for wire bonding emitter electrode 52, as will be explained below.

As shown in the simplified diagram of FIG. 1, hydroxyl groups (OH) are attached on surface 47 of protective film 46. Hydroxyl groups are attached on surface 47 of protective film 46 in a chemically stable condition. Protective film 46 which is made of polyimide is generally hydrophobic because polyimide has hydrophobic properties. However, in a case of semiconductor device 10, by attaching hydroxyl groups on surface 47 of protective film 46, the properties of surface 47 of protective film 46 are altered to have hydrophilic properties. Whereas the contact angle between polyimide having no hydroxyl groups and a water droplet is greater than or equal to 60 degrees, the contact angle between surface 47 having hydroxyl groups attached thereon and the water droplet is less than or equal to 40 degrees. By attaching hydroxyl groups on surface 47 of protective film 46, the hydrophilic properties of surface 47 of protective film 46 are enhanced.

By processing surface 47 of protective film 46 such that surface 47 becomes hydrophilic, a condition can be attained where a high density of water molecules tend to collect at surface 47 of protective film 46. The water molecules that collect at surface 47 of protective film 46 bond with electrical charges that accumulate on surface 47 of and/or within protective film 46. In this way, the electrical charges that accumulate on surface 47 of and/or within protective film 46 are discharged to the outside as ionized water molecules. As a result, the amount of electrical charges that accumulates on surface 47 of and/or within protective 46 film is reduced.

Broken line A of FIG. 1 shows an outer boundary of a depletion layer when semiconductor device 10 is turned off. Broken line B of FIG. 1 shows an outer boundary of a depletion layer in a case where hydroxyl groups are not formed on surface 47 of protective film 46. The end face of the depletion layer of broken line A and that of broken line B illustrate a case where the voltage difference between collector electrode 32 and emitter electrode 52 are equal. When semiconductor device 10 turns off, the depletion layer extends from the pn junction between body region 62 of central region 11 and semiconductor active region 38 towards semiconductor active region 38 of surrounding region 12. As a result, surrounding region 12 becomes depleted, and voltage applied to the semiconductor switching structure can be laterally absorbed.

If hydroxyl groups are not formed on surface 47 of protective film 46, a significant amount of negative charge accumulates on surface 47 of and/or within protective film 46 during the manufacturing, shipping, and packaging processes of the semiconductor device 10. When negative charges accumulate on surface 47 of and/or within protective film 46, positive charges that are attracted by the negative charges accumulate in the surface portion of semiconductor active region 38 of surrounding region 12. The accumulated positive charges cause adjacent guard rings 22 to become electrically connected to each other. Accordingly, in a case where hydroxyl groups are not attached on surface 47 of protective film 46, the depletion layer spreads out within surrounding region 12, even if the voltage is low (refer to broken line B). As a result, high voltage cannot be absorbed, which decreases the strength (breakdown voltage) of the IGBT.

On the other hand, by forming hydroxyl groups on surface 47 of protective film 46, the amount of electrical charges that accumulates on surface 47 of and/or within protective film 46 is reduced. As a result, the balance of electrical charges at semiconductor active region 38 of surrounding region 12 can be maintained. Therefore, the breakdown voltage of the IGBT is prevented from decreasing.

Second Representative Embodiment

Figure 2:
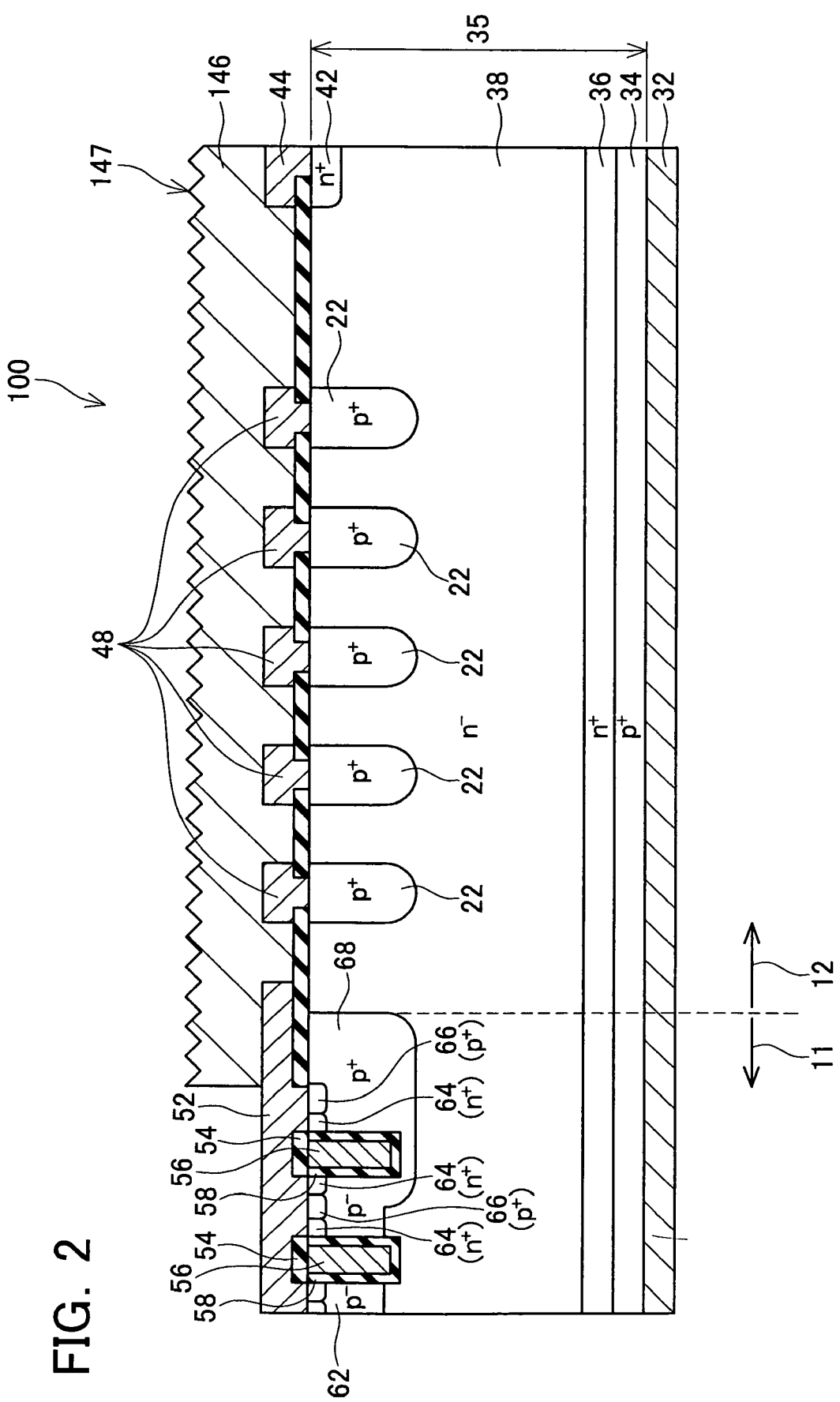
FIG. 2 is a simplified cross-sectional diagram showing a main portion of a semiconductor device according to a second embodiment.

FIG. 2 is a simplified cross-sectional diagram showing a main portion of semiconductor device 100. Component parts identical to those in the first embodiment are indicated with the same reference numerals, and descriptions thereof are omitted.

Surface 147 of protective film 146 of semiconductor 100 is processed such that surface 147 becomes a coarse surface. The average surface coarseness (Ra) of surface 147 of protective film 146 is adjusted to be greater than or equal to 8 nm, and the maximum surface coarseness (Rmax) thereof is adjusted to be greater than or equal to 35 nm. A polyimide surface, formed by a coating process, is generally flat. Further, the average surface coarseness (Ra) of the polyimide surface is less than or equal to 2 nm, and the maximum surface coarseness (Rmax) thereof is less than or equal to 8 nm. On the other hand, as will be explained in a manufacturing method below, surface 147 of protective film 146 is processed so that the average surface coarseness (Ra) of surface 147 is greater than or equal to 8 nm and the maximum surface coarseness (Rmax) thereof is greater than or equal to 35 nm. Surface 147 of protective film 146 can be regarded as being a coarse surface.

By processing surface 147 of protective film 146 so that surface 147 becomes coarse, the area on surface 147 of protective film 146 that scrapes against paper or other objects during a shipping process of the semiconductor device 100 can be reduced, which in turn reduces the amount of electrical charges that accumulates within protective film 146. At the same time, by processing surface 147 of protective film 146 so that surface 147 becomes coarse, the area on surface 147 that contacts gas and liquid also increases. Therefore, in some cases, the area of surface 147 exposed to dry air increases (for example, during a solder reflow process), and consequently, the amount of electrical charges that accumulates on the surface 147 of and/or within protective film 146 might also increase. Further, the area of surface 147 of protective film 146 that contacts cutting water during dicing process increases, and consequently, the amount of electrical charges that accumulates on the surface 147 of and/or within protective film 146 might also increase. However, the amount of decrease in the electrical charges (decrease that results from the decrease in the area on surface 147 of protective film 146 that scrapes against paper or other objects) is larger than the amount of increase in the electrical charges (increase that results from the increase in the area on surface 147 that contacts gas and liquid). Therefore, by processing surface 147 of protective film 146 so that surface 147 becomes a coarse surface, the overall amount of electrical charges that accumulate (during the manufacturing, shipping, and packaging of the semiconductor device) on surface 147 of and/or within protective film 146 can be reduced.

Third Representative Embodiment

Figure 3:
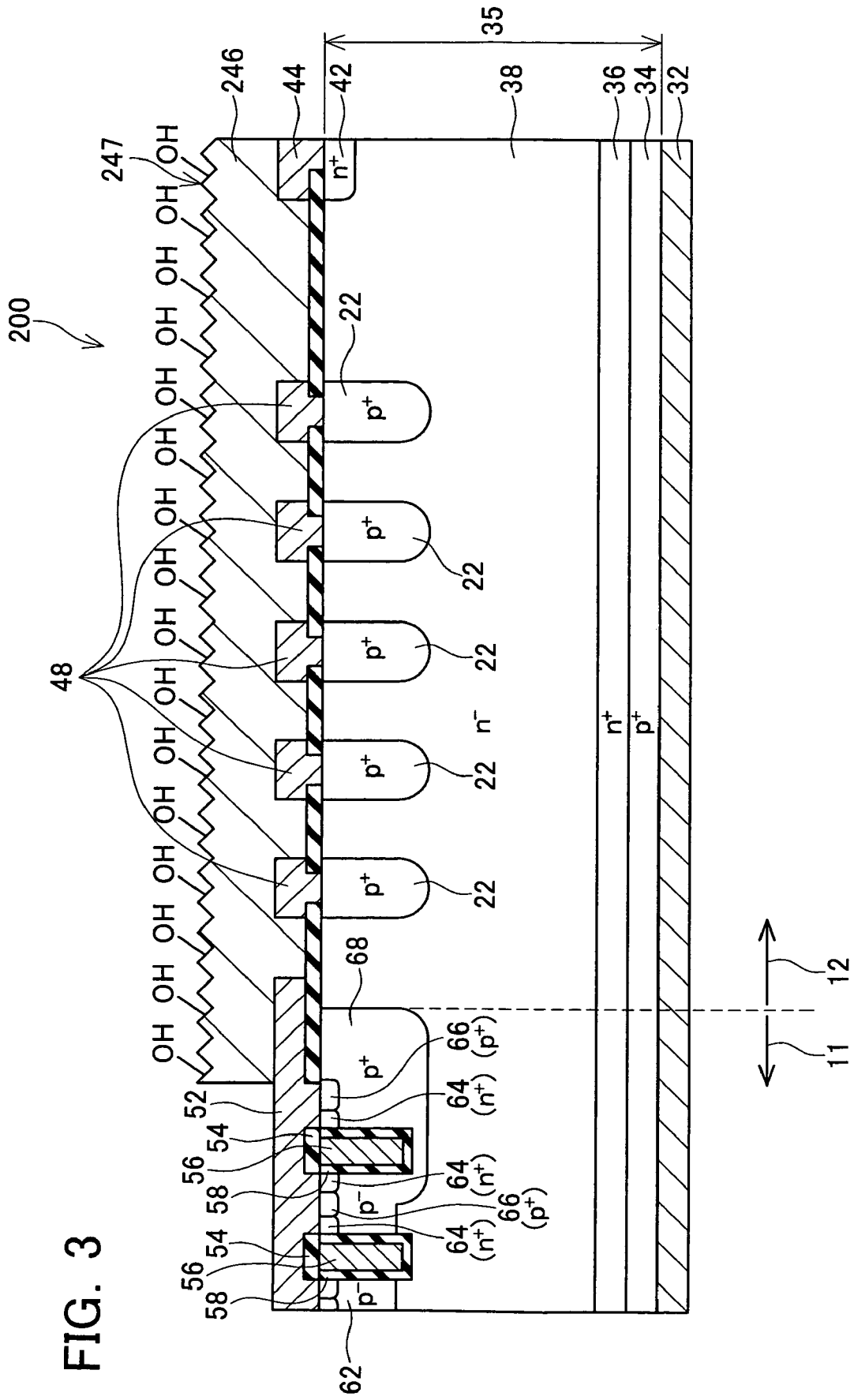
FIG. 3 is a simplified cross-sectional diagram showing a main portion of a semiconductor device according to a third embodiment.

FIG. 3 is a simplified cross-sectional diagram showing a main portion of semiconductor device 200. Component parts identical to those in the first embodiment are indicated with the same reference numerals, and descriptions thereof are omitted.

Surface 247 of protective film 246 of semiconductor device 200 is processed so that hydroxyl groups are attached on surface 247 and so that surface 247 becomes a coarse surface. Surface 247 of protective film 246 of semiconductor device 200 provides hydrophilic properties as well as coarseness. With semiconductor device 200 according to the third embodiment, the amount of electrical charges that accumulates on the surface 247 of and/or within protective film 246 can be significantly reduced. Specifically, by processing surface 247 of protective film 246 so that surface 247 is both hydrophilic and coarse, the probability increases that the water molecules accumulating on surface 247 of protective film 246 will bond with the electrical charges accumulating on the surface 247 of and/or within protective film 246. This promotes bonding between the water molecules and the electrical charges. As a result, the electrical charges that tend to accumulate on the surface 247 of and/or within protective film 246 are discharged to the outside as ionized water molecules, which in turn significantly reduce the amount of electrical charges that accumulates on the surface 247 of and/or within protective film 246.

Figure 4:
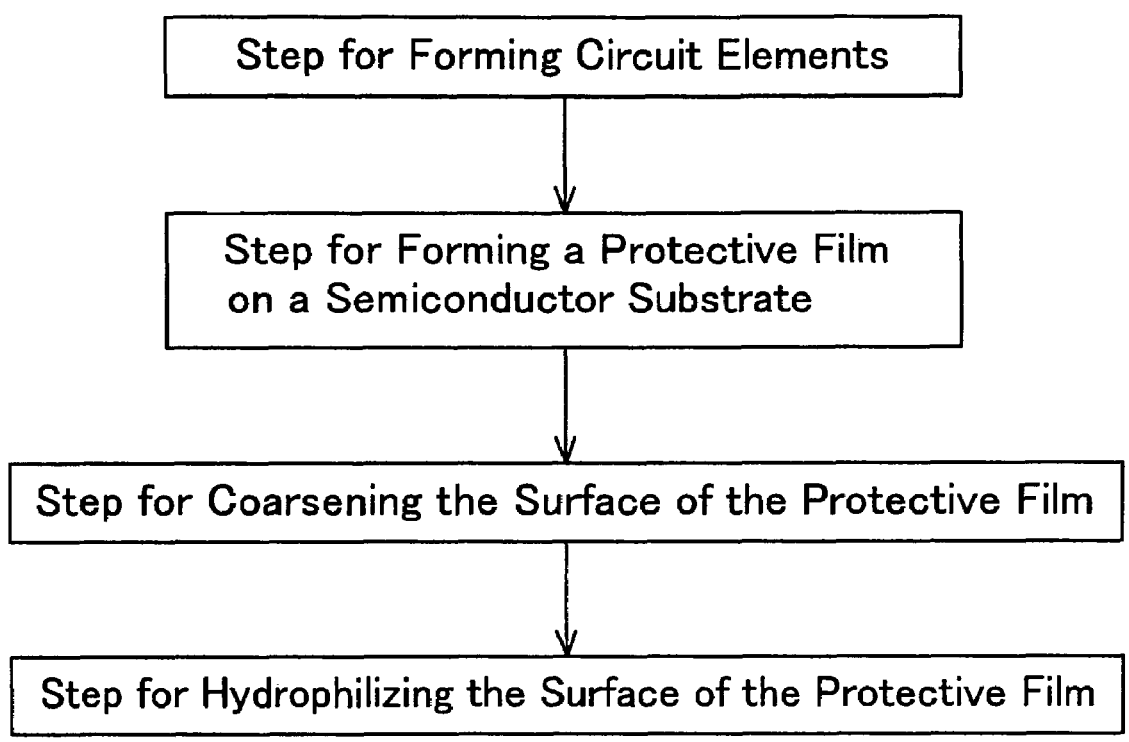
FIG. 4 shows a procedure to manufacture a semiconductor device according to the third embodiment.

Semiconductor device 200 can be manufactured according to the procedures outlined in FIG. 4.

First, circuit elements are formed within semiconductor substrate 35. In the present embodiment, an IGBT with semiconductor switching structures at central region 11 and breakdown voltage increasing structures at surrounding region 12 are formed within semiconductor substrate 35. Well-known manufacturing methods may be used for forming the circuit elements.

Next, protective film 246 made of polyimide is formed above semiconductor substrate 35 with a coating process. The thickness of protective film 246 is adjusted to be approximately 2-20 μm.

Next, the surface of protective film 246 is coarsened. This coarsening step can be implemented with a sputtering process that uses argon gas (Ar). By sputtering surface 247 of protective film 246 with Ar gas, surface 247 of protective film 246 is physically damaged. As a result, surface 247 of protective film 246 is coarsened.

Next, surface 247 of protective film 246 is hydrophilized. The hydrophilization step can be implemented by performing an alcohol process on surface 247 of protective film 246. A preferable alcoholic material to be used for the alcohol process is, for example, IPA (isopropyl alcohol). In order to implement the alcohol process on surface 247 of protective film 246, semiconductor device 200 may be dipped in alcoholic solution. Alternatively, semiconductor device 200 may be exposed to beta alcohol. The hydrophilizing step may alternatively be implemented by coating surface 247 of protective film 246 with silicon oxide powder. In this case, it is preferable that the grain size of the silicon oxide powder is approximately 10-200 nm.

The step of hydrophilizing and step of coarsening surface 247 of protective film 246 can be implemented with a single process. In order to implement these steps with a single process, plasma processing with $O_2$ plasma is performed on surface 247 of protective film 246. By performing the $O_2$ plasma processing on surface 247 of protective film 246, surface 247 of protective film 246 is ashed, and hydroxyl groups are attached to surface 247 of protective film 246. In this way, surface 247 of protective film 246 can be coarsened and hydrophilized with a single process.

The method for hydrophilizing and method for coarsening the protective film of semiconductor device 200 can be utilized with semiconductor device 10 of the first embodiment as well as semiconductor device 100 of the second embodiment.

Examples of specific embodiments of the present invention have been described in detail above. However, the described embodiments are merely examples, and therefore do not limit the scope of the claims of the present invention. Various modifications and adjustments may be made to the techniques described within the scope of the claims of the present invention.

Further, technical elements described in the present specification and or figures produces technical utility either independently or as combinations, and are not limited by the combinations described in the claims at the time the present application is filed. Further, the techniques described in the present specification or figures can simultaneously achieve a number of objectives, and achieving any one of those objectives give technical utility to the present invention.

What is claimed is:

1. A semiconductor device comprising:
   a semiconductor substrate having circuit elements formed therein; and
   a protective film formed on the semiconductor substrate, wherein a top surface of the protective film is exposed to water molecules in the air,
   wherein an average surface coarseness (Ra) of the top surface of the protective film is greater than or equal to 8 nm and a maximum surface coarseness (Rmax) of the top surface of the protective film is greater than or equal to 35 nm.

2. A semiconductor device comprising of claim 1, wherein a contact angle between a surface of the protective film and a water droplet is less than or equal to 40 degrees.

3. The semiconductor device of claim 2, wherein hydroxyl groups are attached on the surface of the protective film.

4. The semiconductor device of claim 1, wherein the protective film contains polyimide, silicon oxide, or silicon nitride.

* * * * *